United States Patent [19]

Hascoe

[11] 4,284,481
[45] Aug. 18, 1981

[54] METHOD OF FABRICATING A METALLIC HERMETIC SEALING COVER FOR A CONTAINER

[76] Inventor: Norman Hascoe, 791 Weaver St., Larchmont, N.Y. 10538

[21] Appl. No.: 143,458

[22] Filed: Apr. 24, 1980

Related U.S. Application Data

[62] Division of Ser. No. 929,836, Jul. 31, 1978, Pat. No. 4,243,729.

[51] Int. Cl.³ .......................... C25D 5/10; C25D 7/06
[52] U.S. Cl. .................................... 204/27; 29/527.4; 204/40
[58] Field of Search ................... 204/27, 40, 213, 29; 29/527.4

[56] References Cited

U.S. PATENT DOCUMENTS 3,472,753  10/1969  Wojtanek ........................ 204/213
3,498,902  3/1970   Wojtanek ........................ 204/213

*Primary Examiner*—T. M. Tufariello
*Attorney, Agent, or Firm*—Laurence B. Dodds

[57] ABSTRACT

A method of fabricating a metallic hermetic sealing cover for a container comprises plating a strip of base metal with a material comprising preponderantly a precious metal such as gold to a thickness of 40% to 90% of the ultimate required minimum surface thickness, which may be 25 to 100 microinches, preferably about 40 microinches, dividing the strip into cover elements of predetermined size, and barrel-plating such cover elements with the plating material to provide a resultant minimum thickness of surface plating substantially equal to the required miniumum thickness.

5 Claims, 7 Drawing Figures

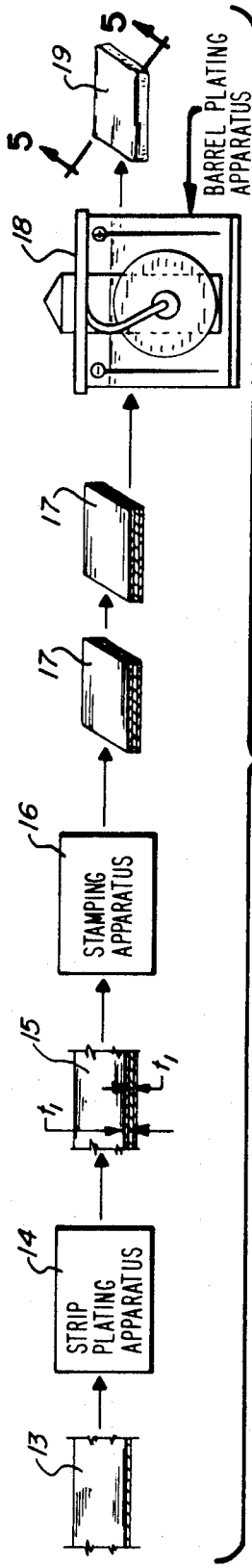
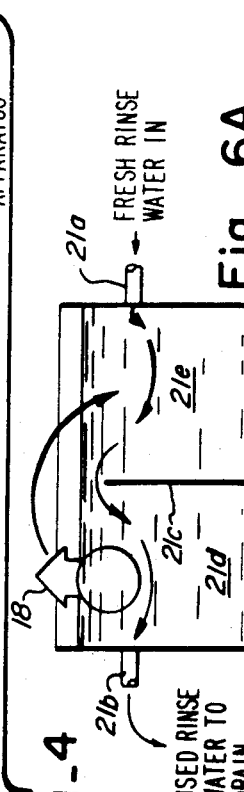
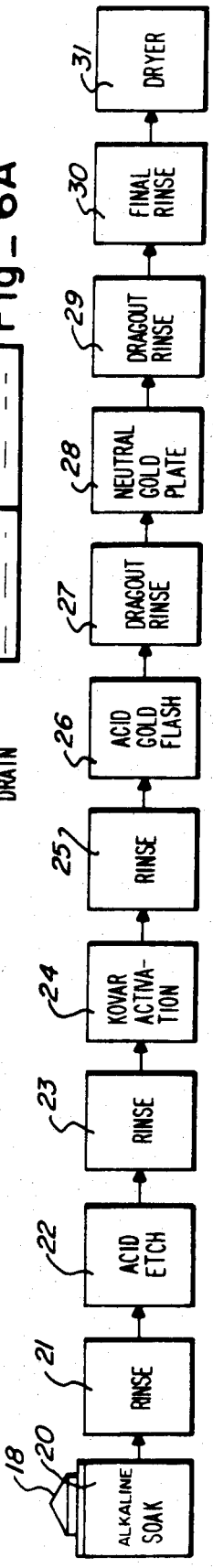

METHOD OF FABRICATING A METALLIC HERMETIC SEALING COVER FOR A CONTAINER

CROSS-REFERENCE TO RELATED APPLICATION

This application is a division of pending application Ser. No. 929,836, filed July 31, 1978, now U.S. Pat. No. 4,243,729 and entitled "A Metallic Hermetic Sealing Cover for a Container".

FIELD OF THE INVENTION

This invention relates to a method of electroplating small plate-like metallic parts which results in an improved predetermined distribution of the plating metal on the parts and the thickness of the plating being substantially uniform from part-to-part. It is particularly advantageous in applications where the plating material is preponderantly a precious metal such as gold.

DESCRIPTION OF THE PRIOR ART

In the semiconductor electronics industry, for a substantial fraction of the semiconductor devices manufactured the active integrated-circuit silicon chip is hermetically sealed into the cavity of a ceramic dual-in-line package using a gold-plated KOVAR lid and gold-tin eutectic solder. The thickness of the gold plating on the lid is specified as a minimum thickness—typically fifty microinches. Many millions of such lids are used each year and the cost of the gold used for plating the lids is several millions of dollars. If the thickness of the gold plating can be controlled so that the distribution of the gold is uniform over the entire area of the part and the thickness just meets the minimum thickness specifications, then the cost-saving of gold metal is obvious. The same reasoning holds for controlling the thickness of the gold plating from part-to-part at the minimum specification.

Because of the very large number of small parts that must be plated, it has been the practice in the plating industry to electroplate the semiconductor lids by the "barrel-plating" technique. This technique is well known and fundamental in the science of electrochemistry. As the lids continually tumble in contact with each other in the rotating barrel, all surfaces of the lids are exposed to the gold-plating solution. After a time, the lids become completely plated with gold. However, on a statistical basis, each individual part does not receive the same exposure to the plating solution and to the same amount of electrical current. Because of the statistical fluctuation of these variables, the thickness of the gold plating on the many thousands of parts in the barrel varies appreciably. By definition of the minimum thickness specification, each and every part in the barrel has to have a plating thickness equal to, or exceeding, this minimum specification. From experience it has been found that the plating thickness from part-to-part varies as much as 50%; i.e., if the minimum plating thickness is specified as fifty microinches, the range of thicknesses from part-to-part can vary from fifty microinches to seventy-five microinches. Obviously, those parts having a plating thickness exceeding the minimum become a loss to the manufacturer in the form of excess gold on many parts.

Another source of loss due to excess gold plating is the nonuniform plating thickness over the area of a single part. The gold ions will tend to plate out on the surface of the lid where the electrical potential gradient is the greatest. When one examines the electrical potential gradient existing around a flat metal part in a plating solution, he will find that the gradient is at a maximum at the edges of the part and a minimum at the center of the part. This nonuniform gradient distribution results in a maximum of gold plating depositing at the edges of the metal part and a minimum at the center of the part. If one profiles the thickness of the gold plating across the diagonal of the flat lid, he will get a so-called "dog bone" contour, indicating minimum thickness in the center and a maximum thickness in the vicinity of the corners. This thickness can vary as much as 40%. For example, a lid measuring fifty microinches of gold thickness in the center can measure seventy microinches at the corners.

This effect is superimposed on the variation in thickness from part-to-part as previously described. As extremes, one may find in the same barrel of gold-plated parts one part having a center thickness of fifty microinches with corner thickness of seventy microinches and another part having a center thickness of seventy-five microinches and corner thickness exceeding one hundred microinches. It is apparent that considerable gold is plated, needlessly resulting in an economic loss because of the variation of plating thickness characteristic of the barrel-plating process.

Alternate electroplating processes are "rack" plating and "strip" plating. In both of these methods, relatively large areas of continuous metal surface are plated. The electrical potential gradient variation is minimized because of the high ratio of central area to edge area and there is no statistical variation of the exposure of various parts of the surface of the plated part due to the tumbling action as in the "barrel" plating process. If a nickel-cobalt-iron alloy such as KOVAR is plated by the "rack" or "strip" method, it will be observed that the plating thickness over almost all of the area will be uniform and can be closely controlled to the specified minimum thickness.

It would appear that a manufacturer of plated small parts could "rack" or "strip" plate large areas of base metal and then stamp the small parts from the uniformly plated metal, thereby closely controlling the thickness of the gold plating from part-to-part and the thickness of the plating across the entire surface of any individual part. Potentially, as much as 40% of the gold required for gold plating could be saved as compared to barrel plating. Gold deposited on the skeleton of the stamped metal can be easily salvaged at very little cost.

However, when a small part is stamped from the relatively large area of plated sheet or strip metal, the edges are left bare of gold-plating. A part with such a characteristic can not be used as a lid for hermetically sealing a semiconductor package for two reasons: first, the bare edges would corrode when exposed to moist air or salt spray as required for acceptance testing of the package; and, secondly, the yield in hermetic sealing would be low because the gold-tin eutectic solder would not wet the bare edges of the lid and form the usual fillet. It has been observed that semiconductor packages sealed with a discontinuous fillet or no fillet around the lid tend to leak much more than those having a continuous fillet around the edge of the lid.

It is an object of the present invention to provide an improved method of electroplating small plate-like metal parts which overcomes the above-described disadvantages of the prior art.

It is a further object of the invention to provide an improved method of electroplating small plate-like metal parts by which the thickness of the plating can be maintained at a substantially uniform specified minimum thickness over the surface of each part and in which the variations of such minimum thickness from part-to-part are maintained at a minimum.

SUMMARY OF THE INVENTION

In accordance with the invention, the method of fabricating a metallic hermetic sealing cover for a container comprises plating a strip of base metal with a material comprising preponderantly a precious metal to a fraction of the ultimate required minimum surface plating thickness, dividing the strip into cover elements of predetermined size, and plating the cover elements with such material to provide a resultant minimum thickness of surface plating substantially equal to the required minimum thickness.

For a better understanding of the present invention, together with other and further objects thereof, reference is had to the following description, taken in connection with the accompanying drawing, while its scope will be pointed out in the appended claims.

BRIEF DESCRIPTION OF THE DRAWING

FIG. 1 is a perspective view of a conventional hermetic sealing cover before plating;

FIG. 2 is a perspective view and

FIG. 3 a cross-sectional view of the sealing cover of FIG. 1 plated with gold by the prior art conventional barrel-plating apparatus, the thickness of the plating being greatly exaggerated for clarity of illustration and the required minimum surface plating thickness being the thickness t;

FIG. 4 is a schematic representation of an apparatus for practicing the method of fabricating sealing covers in accordance with the invention;

FIG. 5 is a cross-sectional view of an hermetic sealing cover fabricated by the apparatus of FIG. 4;

FIG. 6 is a schematic representation of the several steps of operation of the barrel plating effected by the apparatus of FIG. 4; while FIG. 6A is a schematic detail of certain of the rinse tanks of FIG. 6.

DESCRIPTION OF THE PREFERRED EMBODIMENT

Referring now to FIGS. 1, 2, and 3 of the drawing, a prior art unplated hermetic sealing cover 10 is plated in a barrel-plating apparatus, the plated element 11 being shown in perspective in FIG. 2 and in diagonal cross-section in FIG. 3. It will be noted that the cross-section has a so-called "dog bone" shape in which the plating is inherently considerably thicker around the edge portions than in the center of the surface in order to ensure the required minimum surface plating thickness t. The plating material 12 is usually required to be a precious metal such as gold. Therefore, the excess thickness of the plating 12 around the edge portions represents a very considerable cost which does not contribute to the effectiveness of the cover.

Referring now to FIG. 4 of the drawing, there is shown a continuous strip 13 of a base metal, preferably a nickel-cobalt-iron alloy commercially available as KOVAR. The strip 13 has a width such that the waste skeleton, after stamping the elements 10 of FIG. 1, is minimal. This strip 13 is passed through a strip-plating apparatus 14 which may be a purely conventional strip-plating apparatus. The strip 13 is plated by the apparatus 14 with a material comprising preponderantly a precious metal such as gold, the plating thickness being a fraction, for example 40% to 90%, of the ultimate required minimum surface plating thickness, which may be 25 to 100 microinches. The resulting plated strip 15 is shown with plating on its upper and lower surfaces of thickness $t_1$, the conventional strip-plating apparatus being effective to coat the strip 13 substantially uniformly on both surfaces.

The plated strip 15 is then passed through a stamping apparatus 16 for dividing the strip into cover elements of the desired predetermined size. Two of these elements 17,17 are shown. The cover elements 17, 17 are then passed to a barrel-plating apparatus 18 for additionally plating them with the plating material to provide a resultant minimum thickness of surface plating substantially equal to the required minimum thickness. A resultant plated cover element 19 is shown in diagonal cross-section in FIG. 5 and will be described hereinafter. The barrel-plating apparatus 18 may be of the type described and claimed in U.S. Pat. Nos. 3,472,753 and 3,498,902 to Wojtanek, commercially available as the "Sterling" Portable Plating Barrel.

The barrel-plating apparatus may be set up to effect any of several different plating-process sequences. The preferred barrel-plating process is represented in FIG. 6, comprising a series of separate tanks in which the various plating process steps are performed in sequence. Specifically, in tank 20 the cover elements are subjected to an alkaline soaking, the alkaline agent being a solution of a mixture of trisodium phosphate, sodium silicate, and sodium hydroxide, commercially available as tetrasodium EDPA. The alkaline constituents are dissolved in water with a concentration of 8 ounces of alkali powder mix per gallon of solution. The soaking is conducted for approximately 5 minutes at a temperature of 160° F. Following the soaking tank 20 is a counterflow rinse tank 21 containing a rinse water. The rinsing operation performed in tank 21 is shown more clearly in FIG. 6A. The tank is provided with a fresh rinse water inlet 21a and a used rinse water outlet 21b. Between inlet 21a and outlet 21b is a transverse barrier plate 21c forming a weir over which the rinse water flows from the inlet compartment 21e to the outlet compartment 21d. The plating apparatus 18 is initially inserted in compartment 21d which has previously been flushed free of used rinse water and then transferred to compartment 21e for a final rinse. The flow of rinse water in the tank 21 is thus in a direction opposite to the movement of the plating barrel 18 so that the final rinse in the compartment 21e is always a fresh rinse water and leaves the cover elements substantially clean.

Following tank 21 is an acid-etch tank 22 containing a solution of muriatic acid of a concentration of 25% by weight. The cover elements are retained in the tank 22 for approximately 5 minutes at room temperature. Following tank 22 is a counterflow rinse tank 23 substantially like tank 21 described above.

From the tank 23 the cover elements are transported to a tank 24 containing an electrolyte for activating the KOVAR. This electrolyte is a mixture of potassium cyanide and trisodium phosphate in a concentration of 8 ounces of the former and 2 ounces of the latter per gallon. The activation continues for a time period of substantially 10 minutes at 140° F. Electrolysis is effected by passing a current through the tank at the rate of 75 amperes for 60 square feet of surface area of cover elements being plated. After such activation, the cover elements are passed through a counterflow rinse tank 25, also like the rinse tank 21 described above.

After rinsing in tank 25, the cover elements are passed into a tank 26 containing a plating electrolyte including potassium-gold-cyanide of a concentration equivalent to ¼ ounce of gold per gallon. The solution has a Baumé of 12 and a pH of 3.8. This electrolyte is commercially available as "Aurall 364" from Lea-Ronal, Inc., of Freeport, N.Y. The cover elements are retained in the tank 26 for 20 minutes and the electrolyzing current is 45 amperes for 60 square feet of surface area of the cover elements. The processing in the tank 26 results in a "strike" or "flash" of gold coating with a coating thickness of less than 10 microinches, preferably approximately 7 microinches. This "flash" gold coating is used to effect a better adherence of the final gold-plating and to reduce the contamination of the final plating tank electrolyte by dissolved KOVAR in a subsequent step of the plating process.

After such "flash" coating in tank 26, the cover elements are passed into tank 27 known as the "drag-out" rinse. After such rinse, the cover elements are passed to the neutral gold-plating tank 28 which contains an electrolyte including potassium-gold-cyanide with a concentration equivalent to 1 ounce of gold per gallon. A preferred plating solution is a proprietary product commercially available as "Aurall 292M" from Lea-Ronal, Inc. referred to above. The cover elements remain in the tank 28 for 50 minutes at 140° F. while the electrolyzing current is 30 amperes for 60 square feet of surface area of the cover elements. This results in a minimum plating thickness of 50 microinches.

From tank 28 the plated parts are removed to tank 29 which is a "drag-out" rinse similar to that effected in the tank 27. The gold solution remaining on the parts after plating is washed off in the "drag-out" tanks 27 and 29 and the residual gold is recovered from the outputs of the tanks 27 and 29. From the tank 29, the cover elements are inserted in the final rinse tank 30 containing deionized water. From the tank 30, the cover elements are removed from the barrel and placed in stainless steel or plastic baskets and, thereafter, disposed in a dryer 31 filled with FREON cleaner with a surfactant agent to displace the water. This process is similar to that described and claimed in U.S. Pat. Nos. 3,386,181 and 3,397,150. The FREON quickly vaporizes and condenses in a degreaser type tank. It has been found possible to dispose 30,000 cover elements in the barrel of the plating apparatus 18 for each plating operation.

Coming back to FIG. 5 which, as stated, represents a diagonal cross-sectional view of the plated cover element 19 resulting from the plating system of FIG. 4, it is seen that it comprises one of the cover elements 17 plated only on its upper and lower surfaces with a material comprising preponderantly a precious metal, for example gold, of a thickness $t_1$ effected in the strip-plating apparatus 14 and an additional gold-plating of thickness $t_2$ on both the upper and lower surfaces and on all edges. The resultant thickness $(t_1+t_2)$ on the upper and lower surfaces is substantially equal to a predetermined specified thickness of 25-100 microinches, preferably approximately 50 microinches. However, the edges of the cover element 19 are plated with the plating material only to a thickness $t_2$ which is a minor fraction of such predetermined thickness, within a range of 3-15 microinches and preferably about 10 microinches.

Comparing FIG. 5 with FIG. 3, representative of the prior art plated cover element 11, it is noted that the pronounced bulging of the plating material on the latter from the center of the upper and lower surfaces and continuing around the edges of the cover element is substantially reduced in the cover element of FIG. 5, although the bulging is exaggerated in FIG. 5 for clarity of illustration. At the same time, the thinner plating around the edges of the cover element is adequate since the gold alloy solder ring by which the cover element is fused to the semiconductor container to form an hermetic seal also forms a protecting fillet around the edges of the cover element which far exceeds the minimum plating thickness specified for the cover element. It is only necessary that the gold plating of the edges of the cover element be sufficient to form a reliable fused bond between the solder ring fillet and the edges of the cover element, as pointed out above.

It has been found that the amount of gold required for plating the cover element 19 of FIG. 5 is approximately 35% less than that required in the prior art plated cover element 11 of FIG. 3 without in any way sacrificing the hermetic sealing capability of the cover element. Such a reduction in the amount of required gold-plating obviously results in a substantial reduction in the cost of the cover element.

While there has been described what is, at present, considered to be the preferred embodiment of the invention, it will be obvious to those skilled in the art that various changes and modifications may be made therein, without departing from the invention, and it is therefore aimed in the appended claims to cover all such changes and modifications which fall within the true spirit and scope of the invention.

What is claimed is:

1. The method of fabricating a metallic hermetic sealing cover for a container comprising:
    plating a strip of base metal with a material comprising preponderantly a precious metal to a fraction of the ultimate required minimum surface plating thickness;
    dividing said strip into cover elements of predetermined size;
    and plating said cover elements with said material to provide a resultant minimum thickness of surface plating substantially equal to the required minimum thickness.

2. The method of fabricating a metallic hermetic sealing cover in accordance with claim 1 in which the plating material is gold.

3. The method of fabricating a metallic hermetic sealing cover in accordance with claim 1 in which the base metal strip is plated to a thickness of 40% to 90% of the ultimate required minimum plating thickness.

4. The method of fabricating a metallic hermetic sealing cover in accordance with claim 1 in which the required minimum surface plating is within the range of 25 to 100 microinches.

5. The method of fabricating a metallic hermetic sealing cover in accordance with claim 1 in which the plating of said cover elements is by barrel-plating.

* * * * *